(12) United States Patent
Yen et al.

(10) Patent No.: US 9,401,465 B2
(45) Date of Patent: Jul. 26, 2016

(54) LIGHT EMITTING DIODE HAVING MIRROR PROTECTION LAYER AND METHOD FOR MANUFACTURING MIRROR PROTECTION LAYER

(71) Applicant: HIGH POWER OPTO. INC., Taichung (TW)

(72) Inventors: Wei-Yu Yen, Taichung (TW); Li-Ping Chou, Taichung (TW); Fu-Bang Chen, Taichung (TW); Chih-Sung Chang, Taichung (TW)

(73) Assignee: HIGH POWER OPTO. INC., Taichung (TW)

( * ) Notice: Subject to any disclaimer, the term of this patent is extended or adjusted under 35 U.S.C. 154(b) by 0 days.

(21) Appl. No.: 14/517,502

(22) Filed: Oct. 17, 2014

(65) Prior Publication Data

US 2016/0111612 A1      Apr. 21, 2016

(51) Int. Cl.
*H01L 33/58* (2010.01)
*H01L 33/60* (2010.01)
*H01L 33/38* (2010.01)

(52) U.S. Cl.
CPC .............. *H01L 33/60* (2013.01); *H01L 33/38* (2013.01); *H01L 2933/0016* (2013.01); *H01L 2933/0058* (2013.01)

(58) Field of Classification Search
None
See application file for complete search history.

(56) References Cited

U.S. PATENT DOCUMENTS

| 8,546,831 | B1 * | 10/2013 | Chen | H01L 33/10 257/72 |
| 8,766,303 | B2 | 7/2014 | Yen et al. | |
| 2008/0261378 | A1 * | 10/2008 | Yao | C30B 25/02 438/458 |
| 2012/0224256 | A1 * | 9/2012 | Dasbach | B23K 26/18 359/350 |
| 2014/0061695 | A1 | 3/2014 | Yen et al. | |

* cited by examiner

*Primary Examiner* — Pamela E Perkins
(74) *Attorney, Agent, or Firm* — Muncy, Geissler, Olds & Lowe, P.C.

(57) ABSTRACT

The present invention includes an N-type semiconductor layer, an active layer, a P-type semiconductor layer, a metal mirror layer, a protection adhesive layer and a metal buffer layer that are sequentially stacked. The protection adhesive layer is selected from a group consisting of a metal oxide and a metal nitride, fully covers one side of the metal mirror layer away from the P-type semiconductor layer, and includes a plurality of conductive holes. The metal buffer layer penetrates through the conductive holes to be electrically connected to the metal mirror layer. After forming the metal mirror layer on the P-type semiconductor layer, the protection adhesive layer that fully covers the metal mirror layer is directly formed to thoroughly protect the metal mirror layer by using the protection adhesive layer, thereby maintaining a reflection rate of the metal mirror layer and ensuring light emitting efficiency of a light emitting diode.

11 Claims, 10 Drawing Sheets

LIGHT EMITTING DIODE HAVING MIRROR PROTECTION LAYER AND METHOD FOR MANUFACTURING MIRROR PROTECTION LAYER

FIELD OF THE INVENTION

The present invention relates to a light emitting diode (LED), and particularly to an LED for enhancing light extraction efficiency.

BACKGROUND OF THE INVENTION

Referring to FIG. 1, a conventional vertical LED includes a sandwich structure formed by an N-type semiconductor layer 1, an active layer 2 and a P-type semiconductor layer 3. Below the P-type semiconductor layer 3, a metal mirror layer 4, a metal buffer layer 5, a binding layer 6, a silicon substrate 7 and a P-type electrode 8 are disposed in sequence. A surface of the N-type semiconductor layer 1 is processed by a roughening treatment for increasing light extraction. An N-type electrode 9 is further provided. By applying a voltage to the N-type electrode 9 and the P-type electrode 8, the N-type semiconductor layer 1 is enabled to provide electrons and the P-type semiconductor layer 3 is enabled to provide holes. Light is produced by the electrons and holes that combine at the active layer 2.

Conventionally, to increase the light extraction efficiency of an LED, the light emitted from the active layer 2 is generally reflected by the metal mirror layer 4. Thus, the metal mirror layer 4 is selected from a silver/titanium tungsten/platinum alloy coating, a silver/titanium/platinum alloy coating, a silver/titanium/tungsten/nickel alloy coating or a silver/nickel alloy coating having high reflection efficiency. Through properties of high reflection efficiency and high thermal stability of the metal mirror layer 4 selected from the above materials, the amount of reflected light is maximized to increase the light extraction efficiency while also maintaining stable electrical characteristics.

However, in the LED, after forming the metal mirror layer 4 below the P-type semiconductor layer 3, the buffer layer 5 and the binding layer 6 need to be formed by further involving numerous semiconductor processes. As a result, the silver in the mirror layer 4 is liable to oxidation in the subsequent processes, such that the reflection efficiency of the mirror layer 4 is degraded to thus lower the light extraction efficiency of the LED.

To solve the above issue, referring to FIG. 2 and FIG. 3, the U.S. Pat. No. 8,766,303, "Light-emitting diode with a mirror protection layer", discloses a structure including an N-type electrode 10, an N-type semiconductor layer 11, a light emitting layer 12, a P-type semiconductor layer 13, a metal mirror layer 14, a protection layer 15B, a protection adhesive layer 15A, a metal buffer layer 16, a binding layer 17, a permanent substrate 18, and a P-type electrode 19. The protection adhesive layer 15A and the protection layer 15B are formed at one side of the metal mirror layer 14 away from the P-type semiconductor layer 13 (as shown in FIG. 2), and shield a side edge of the metal mirror layer 14.

Alternatively, the protection adhesive layer 15A and the protection layer 15B are formed between the P-type semiconductor layer 13 and the metal buffer layer 16 (as shown in FIG. 3), and shield a side edge of the metal mirror layer 14. Thus, the P-type semiconductor layer 13, the protection adhesive layer 15A, the protection layer 15B and the buffer layer 16 completely shield a side edge of the metal mirror layer 14, so as to prevent the metal mirror layer 14 from oxidation in the subsequent processes.

In the above known technology, the protection layer 15B is selected from a group consisting of titanium dioxide, silicon dioxide, aluminum oxide and tin indium oxide, and features a high stability and sustainable physical properties. It is to be noted that, the protection adhesive layer 15A is formed by titanium, tungsten and chromium, and a metal alloy incorporating these elements. In general, the application of such metal adhesive layer in a normal environment (with temperature between 20° C. and 27° C. and humidity between 50% and 60%), the issue of unsatisfactory adhesion of an oxide can be overcome. However, when exposed to high current density operations in an extreme environment, the protection adhesive layer 15A may not steadily clad the protection layer 15B at the edge of the metal mirror layer 14 due to thermal expansion and water oxidation. As a result, the metal mirror layer 14 inevitably becomes oxidized in the subsequent processes to fail the expected application requirements.

SUMMARY OF THE INVENTION

It is a primary object of the present invention to provide a light emitting diode (LED) having a mirror protection layer capable of fully covering a metal mirror layer. As such, in extreme environment and under high current density operations, adhesion of the protection layer can still be maintained to prevent peeling and falling off, thereby thoroughly protecting the metal mirror layer.

It is a secondary object of the present invention to provide a method for manufacturing a mirror protection layer for reducing an exposure period of a metal mirror layer. Thus, the metal mirror layer is effectively prevented from oxidation to ensure a reflection rate of the metal mirror layer for satisfying application requirements.

A structure of the present invention includes an N-type electrode, an N-type semiconductor layer, an active layer, a P-type semiconductor layer, a metal mirror layer, a protection adhesive layer, a metal buffer layer, a binding layer, a permanent substrate and a P-type electrode. The protection adhesive layer is selected from a group consisting of a metal oxide and a metal nitride. The protection adhesive layer fully covers one side of the metal mirror layer away from the P-type semiconductor layer, and includes a plurality of conductive holes. The metal buffer layer penetrates through the plurality of conductive holes to be electrically connected to the metal mirror layer.

The method for manufacturing the mirror protection layer of the present invention includes steps of: forming the metal mirror layer on the P-type semiconductor layer; forming the protection adhesive layer that fully covers the metal mirror layer on the metal mirror layer; excavating the plurality of conductive holes that penetrate through the protection adhesive layer to reach the metal mirror layer; and forming the metal buffer layer on the protection adhesive layer, the metal buffer layer penetrating through the plurality of conductive holes to be electrically connected to the metal mirror layer.

Accordingly, in the present invention, the protection adhesive layer fully covers the metal mirror layer to thoroughly protect the metal mirror layer. In an extremely environment and under high current density operations, the adhesion of the protection adhesive layer is maintained to prevent the metal mirror layer from oxidation in subsequent processes, thereby maintaining the reflection efficiency of the metal mirror layer. That is, the light generated by the light emitting layer can be fully reflected to enhance the light extraction efficiency and electrical stabilities of the LED.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Details and technical contents of the present invention are described in the embodiments below. It should be noted that, these non-limiting embodiments are for explaining the present invention to one skilled in the art, and are not to be construed as limitations to the present invention.

Figure 1:
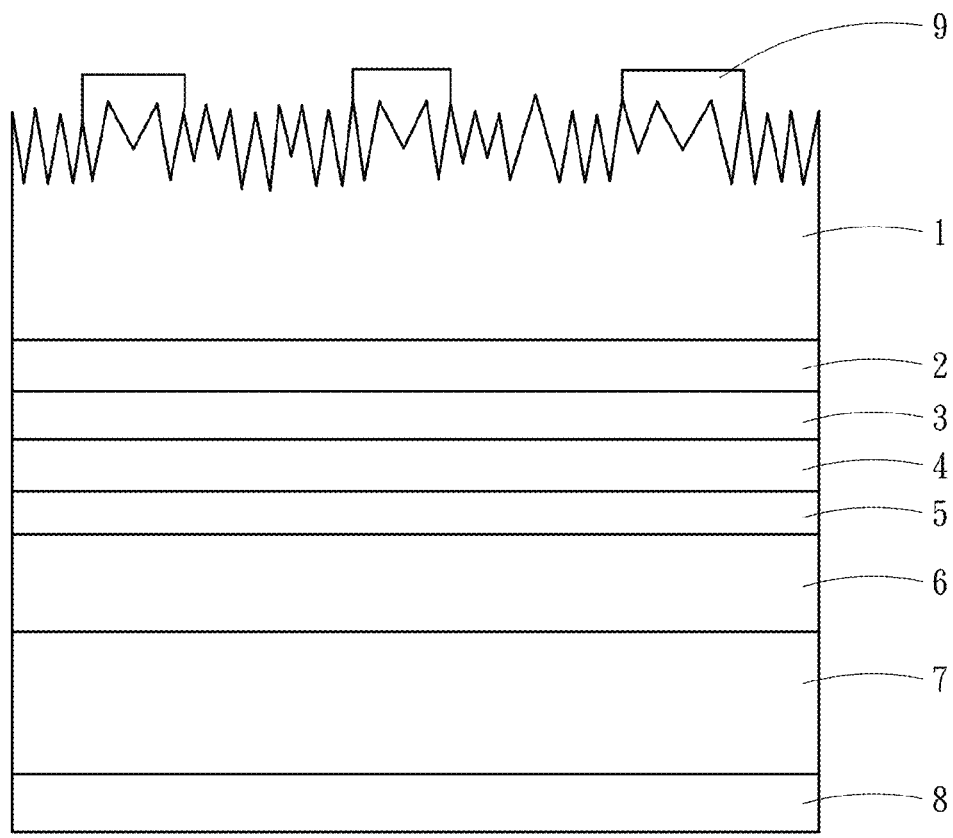
FIG. 1 is a structural diagram of a conventional light emitting diode (LED).
Figure 2:
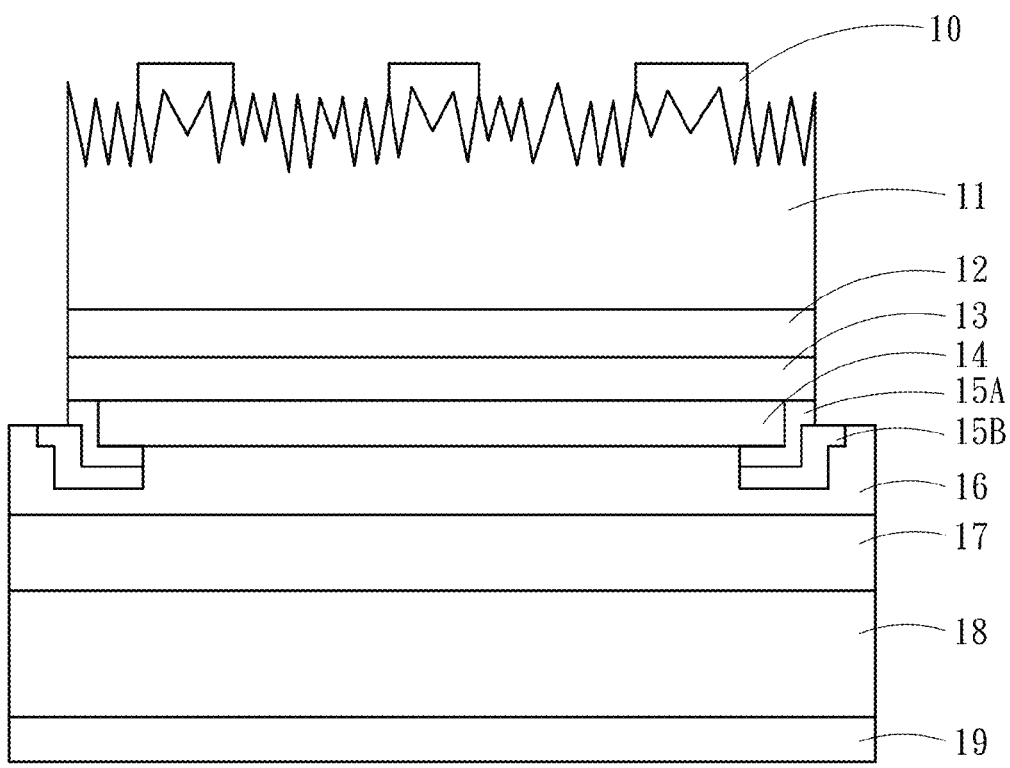
FIG. 2 is a first structural diagram of a conventional LED disclosed by the U.S. Pat. No. 8,766,303.
Figure 3:
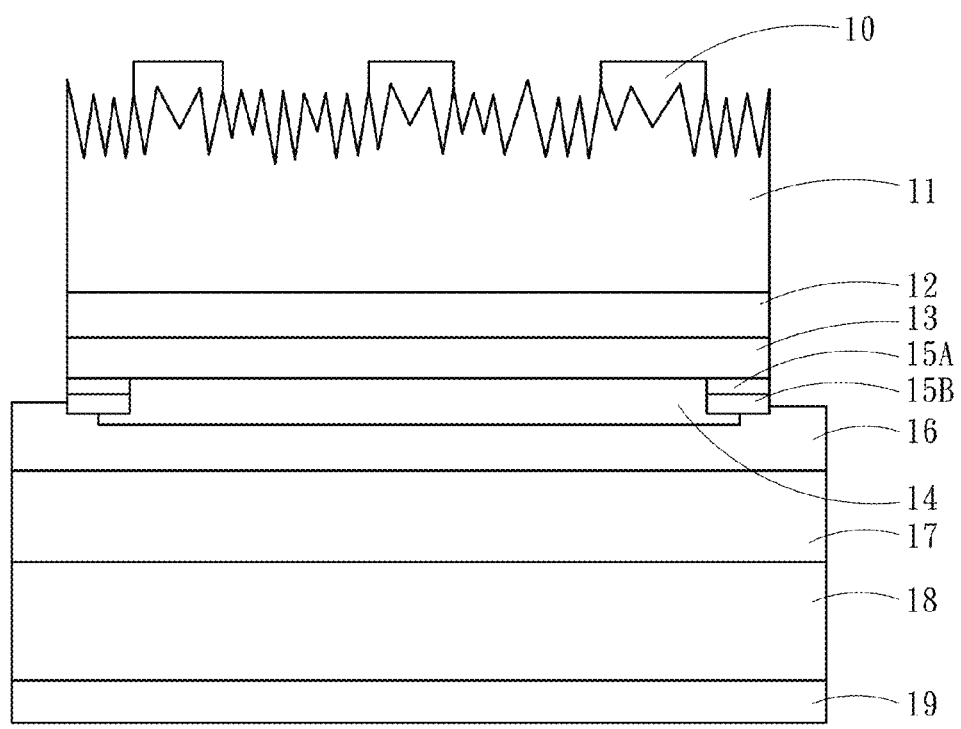
FIG. 3 is a second structural diagram of a conventional LED disclosed by the U.S. Pat. No. 8,766,303.
Figure 4:
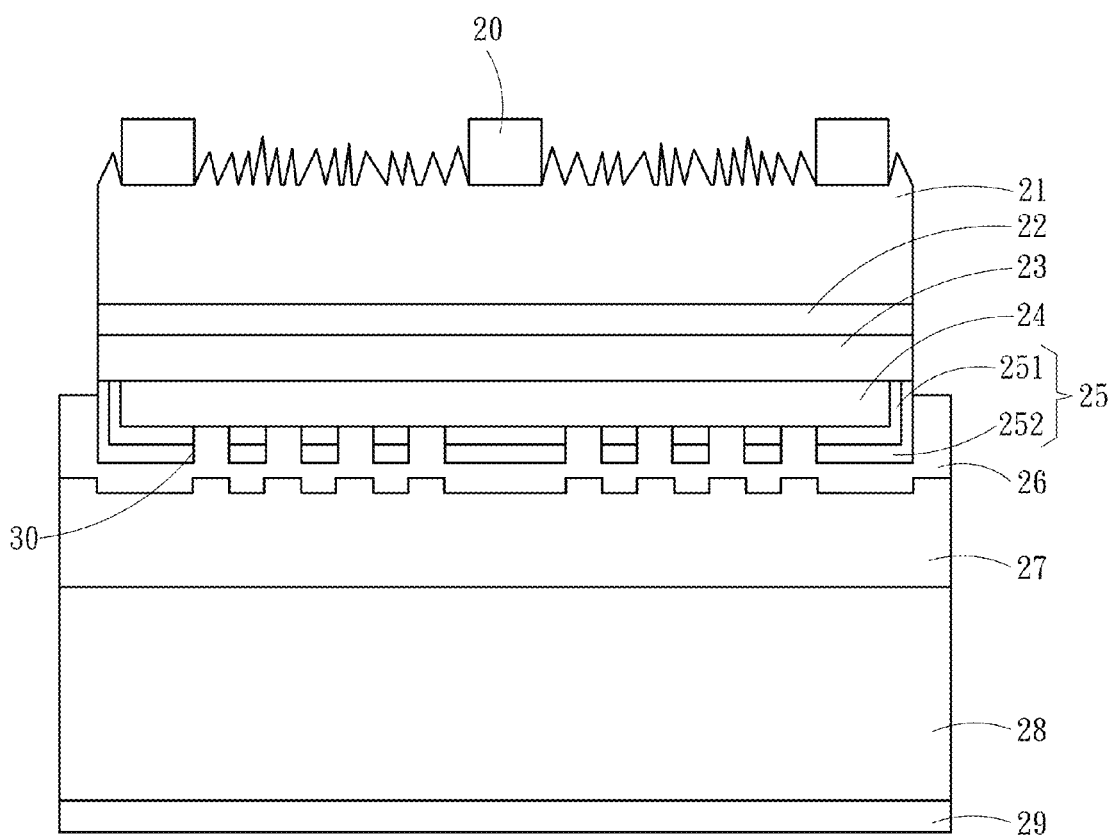
FIG. 4 is a structural diagram of a light emitting diode (LED) of the present invention.

Referring to FIG. 4, a structure of the present invention includes an N-type electrode 20, an N-type semiconductor layer 21, an active layer 22, a P-type semiconductor layer 23, a metal mirror layer 24, a protection adhesive layer 25, a metal buffer layer 26, a binding layer 27, a permanent substrate 28, and a P-type electrode 29.

The protection adhesive layer 25 is selected from a group consisting of a metal oxide and a metal nitride, and structurally includes an adhesive layer 251 and a protection layer 252. Further, the protection layer 25 fully covers one side of the metal mirror layer 24 away from the P-type semiconductor layer 23, and includes a plurality of conductive holes 30. The metal buffer layer 26 penetrates through the plurality of conductive holes 30 to be electrically connected to the metal mirror layer 24. To allow the conductivity between the metal buffer layer 26 and the metal mirror layer 24 to meet requirements, an area of any of the plurality of conductive holes 30 needs to be smaller than or equal to ½ of an area of the protection adhesive layer 25, such that a region occupied by the plurality of conductive holes 30 is not too large or too small. Further, a distance between centers of any two adjacent conductive holes 30 needs to be smaller than or equal to ½ and greater than 1/20 of a smallest side of the protection adhesive layer 25, so as to prevent the distance between every two conductive holes 30 from being too small or too large.

The binding layer 27 binds the permanent substrate 28 and the metal buffer layer 26. The permanent substrate 28 is a common conductive silicon substrate.

Figure 5:
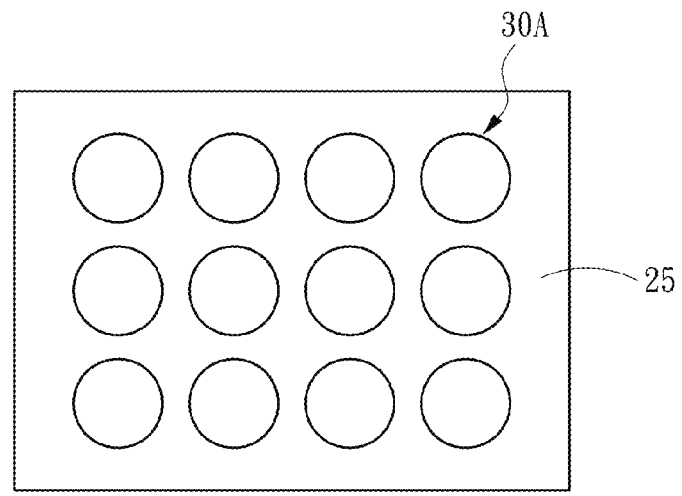
FIG. 5 to FIG. 12 are structural diagrams of an LED of the present invention.
Figure 6:
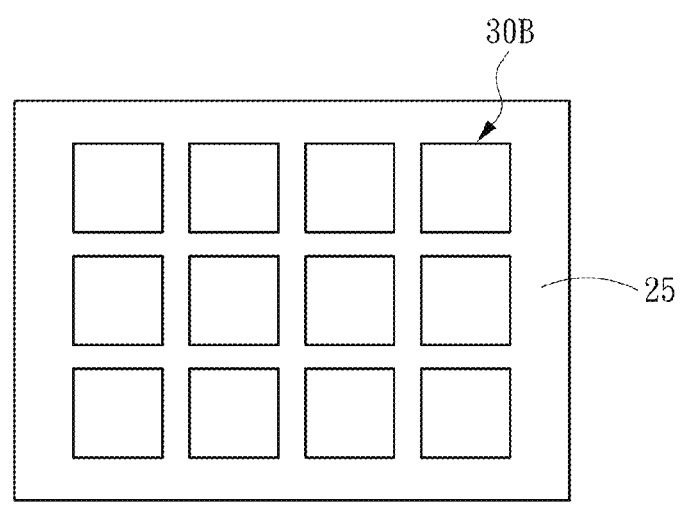
Figure 7:
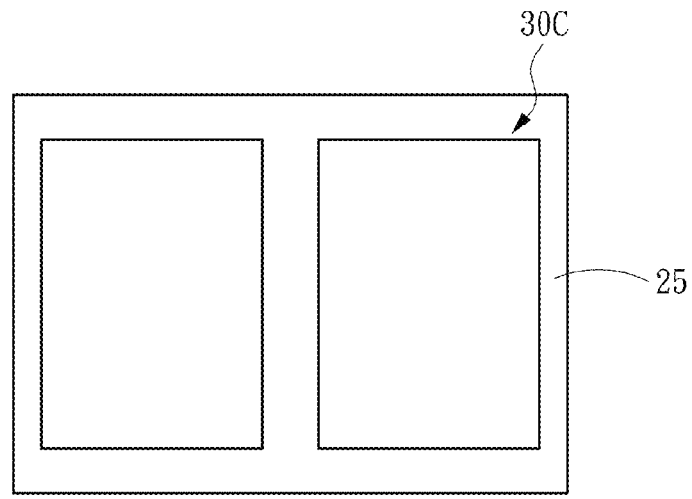
Figure 8:
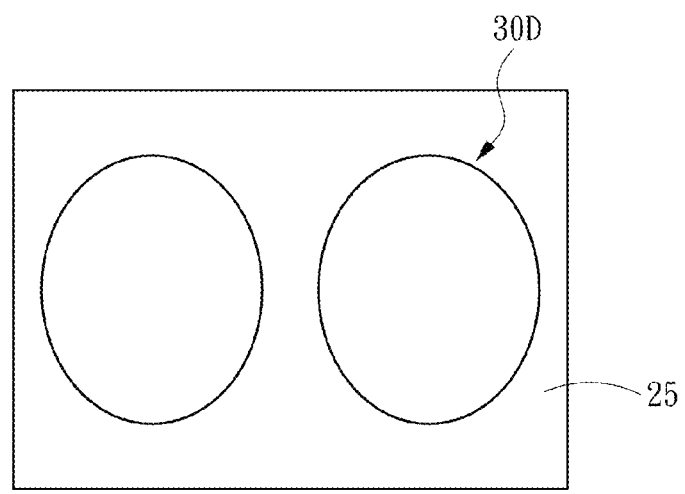
Figure 9:
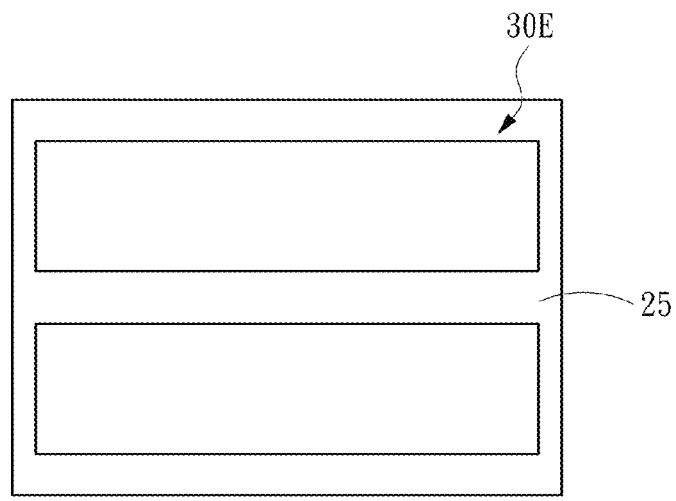
Figure 10:
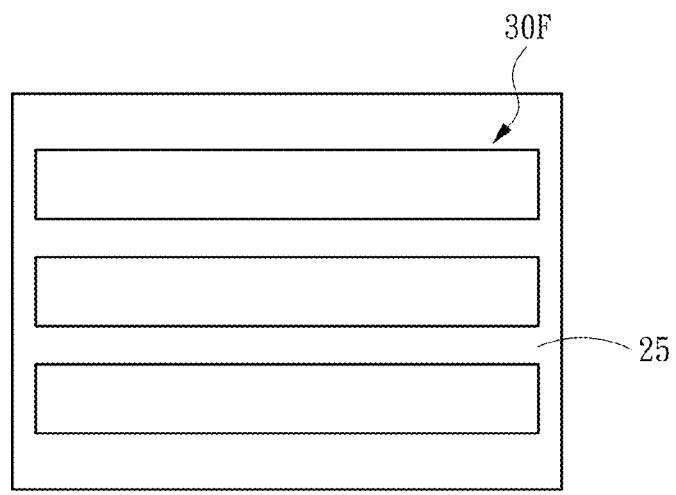

FIG. 5 to FIG. 12 show shapes and arrangements of a plurality of conductive holes 30A, 30B, 30C, 30D, 30E and 30F disposed on the protection adhesive layer 25 according to different embodiments of the present invention. As shown in FIG. 5, the plurality of conductive holes 30A on the protection adhesive layer 25 may be circular holes in an array. Alternatively, as shown in FIG. 6, the plurality of conductive holes 30B on the protection adhesive layer 25 may be square holes in an array. Alternatively, as shown in FIG. 7, the plurality of conductive holes 30C on the protection adhesive layer 25 may be two rectangular holes in a left-right arrangement. Alternatively, as shown in FIG. 8, the plurality of conductive holes 30D may be two circular holes in a left-right arrangement. Alternatively, as shown in FIG. 9, the plurality of conductive holes 30E on the protection adhesive layer 25 may be two rectangular holes in a top-bottom arrangement. Alternatively, as shown in FIG. 10, the plurality of conductive holes 30F on the protection adhesive layer 25 may be three rectangular holes in a top-bottom arrangement.

Figure 11:
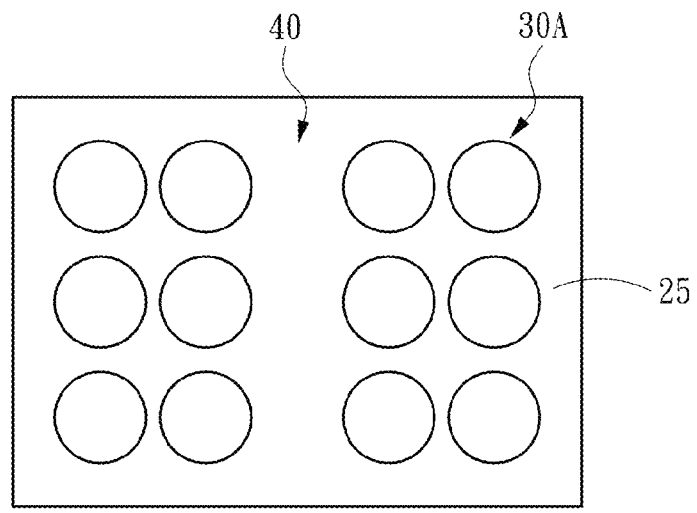
Figure 12:
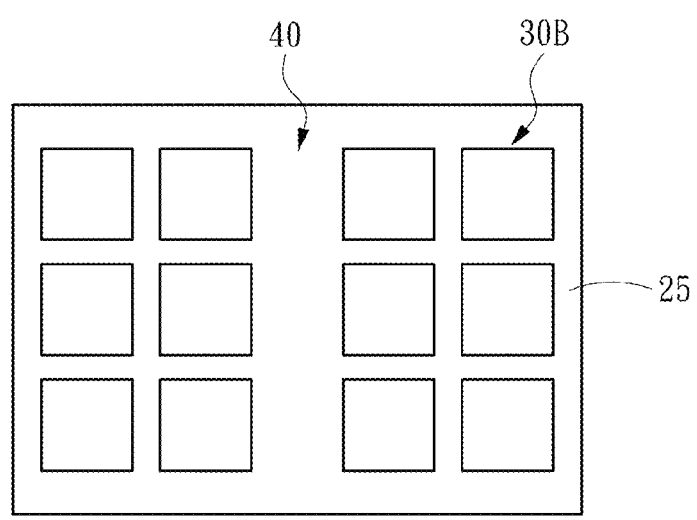
Figure 13A:
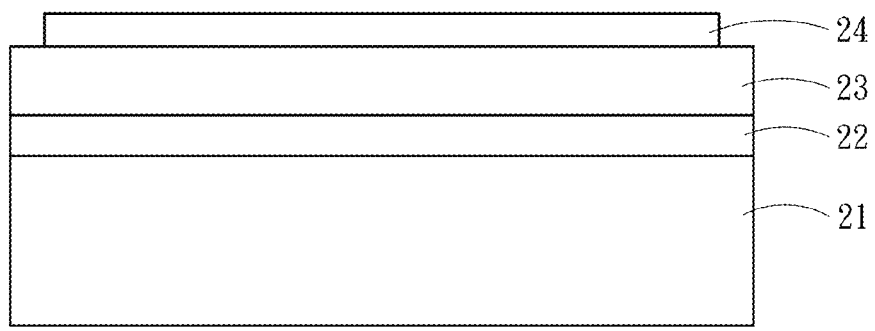
FIG. 13A to FIG. 13D are structural diagrams of a manufacturing process of a mirror protection layer of the present invention.
Figure 13B:
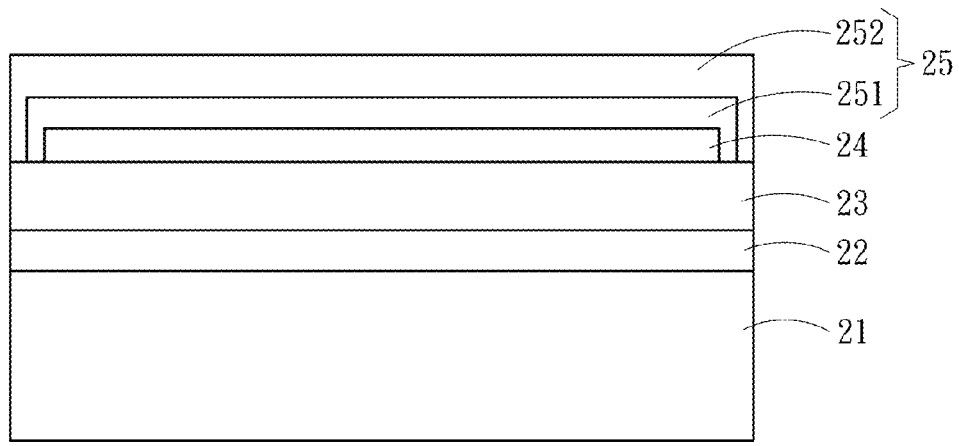
Figure 13C:
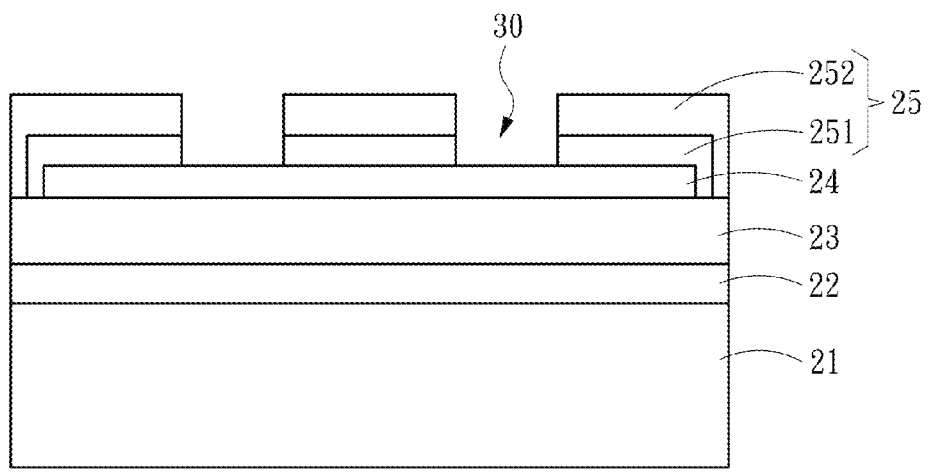
Figure 13D:
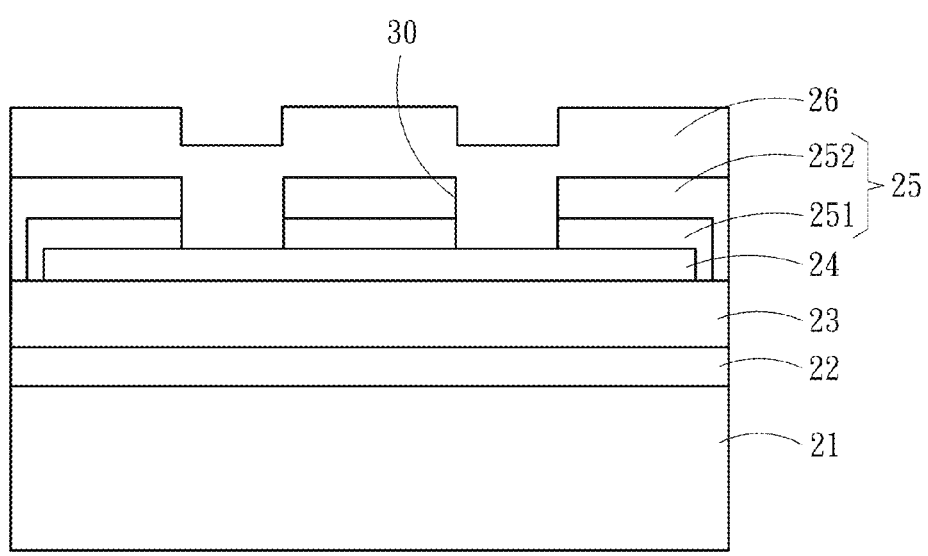

A part of the metal mirror layer 24 right below N-type electrode 20 is a position where the current is most concentrated. To fully protect that part of the metal mirror layer 24 right below the N-type electrode 20, as shown in FIG. 11 and FIG. 12, a region of the protection adhesive layer 25 corresponding to right below the N-type electrode 20 is a bypass region 40, in which the plurality of conductive holes 30A and 30B are not at all disposed. Contours of the plurality of conductive holes 30A and 30B may be circles, squares or other shapes.

Referring to FIG. 13A to FIG. 13D and the structure disclosed above, a method for manufacturing the metal mirror layer includes following steps.

The metal mirror layer 24 is formed on the P-type semiconductor layer 23. The metal mirror layer 24 may be a silver/titanium tungsten/platinum alloy coating. In a preferred embodiment, the silver has a thickness between 100 nm and 300 nm, the titanium tungsten has a thickness between 20 nm and 300 nm, and the platinum has a thickness smaller than 500 nm. Alternatively, the metal mirror layer 24 may be a silver/titanium/platinum alloy coating. Similarly, in a preferred embodiment, the silver has a thickness between 100 nm and 300 nm, the titanium has a thickness between 20 nm and 300 nm, and the platinum has a thickness smaller than 500 nm. Alternatively, the metal mirror layer 24 may be a silver/titanium/nickel alloy coating. Similarly, in a preferred embodiment, the silver has a thickness between 100 nm and 300 nm, the titanium has a thickness between 20 nm and 300 nm, and the nickel has a thickness smaller than 500 nm. Alternatively, the metal mirror layer 24 may be a silver/nickel alloy coating. Similarly, in a preferred embodiment, the silver has a thickness between 100 nm and 300 nm, and the nickel has a thickness smaller than 2000 nm.

The protection adhesive layer 25 that fully covers the metal mirror layer 24 is formed on the metal mirror layer 24. The protection adhesive layer 25 structurally includes the adhesive layer 251 and the protection layer 252. To form the adhesive layer 251, nitrogen, argon and ammonia are induced onto the metal mirror layer 24 to form an adhesion bond through plasma enhanced chemical vaporization deposition (PECVD), and silane ($SixHy$) is then induced to deposit silicon nitride ($SixNy$) or silicon oxide ($SiO_2$) to form a group consisting of a metal oxide and a metal nitride. Preferably, the adhesive layer 251 has a thickness smaller than 5 nm. The protection layer 252 is similarly made of a material selected from a group consisting of a metal oxide and a metal nitride, and is further deposited and formed on the adhesive layer 251 through PECVD. Further, the protection layer 252 has a thickness between 30 nm and 200 nm.

The plurality of conductive holes 30 that penetrate through the protection adhesive layer 25 to become conducted to the metal mirror layer 24 are excavated on the protection adhesive layer 25. For example, the plurality of conductive holes 30 may be formed by a semiconductor process such as dry etching.

The metal buffer layer 26, which penetrated through the plurality of conductive holes 30 to be electrically connected to the metal mirror layer 24 are formed on the protection adhesive layer 25. Further, the metal buffer layer 26 is selected from a metal having good electrical conductivity and stability, and has a thermal expansion coefficient between those of gallium nitride and silicon to serve as a metal buffer layer between a silicon substrate and a gallium nitride epitaxial layer. For example, the metal buffer layer 26 is selected from titanium, platinum, titanium tungsten and nickel.

In the present invention, the metal mirror layer is thoroughly protected by using the protection adhesive layer that fully covers the metal mirror layer. In other words, even in an extreme environment and under high current density operations, the present invention is capable of sustaining adhesion of the protection layer and preventing the metal mirror layer from oxidation in the subsequent processes, thereby maintaining the reflection efficiency of the metal mirror layer. That is, the light generated by the light emitting layer can be fully reflected to enhance the light extraction efficiency and electrical stabilities of the LED to meet application requirements.

What is claimed is:

1. A light emitting diode (LED) having a mirror protection layer, comprising an N-type electrode, an N-type semiconductor layer, an active layer, a P-type semiconductor layer, a metal mirror layer, a protection adhesive layer, a metal buffer layer, a binding layer, a permanent substrate and a P-type electrode, the LED being characterized in that:
   the protection adhesive layer is selected from a group consisting of a metal oxide and a metal nitride, fully covers one side of the metal mirror layer away from the P-type semiconductor layer, and comprises a plurality of conductive holes; the metal buffer layer penetrates through the plurality of conductive holes to be electrically connected to the metal mirror layer.

2. The LED having a mirror protection layer of claim 1, wherein the protection adhesive layer structurally comprises an adhesive layer and a protection layer.

3. The LED having a mirror protection layer of claim 2, wherein the adhesive layer is selected from a group consisting of a metal oxide and a metal nitride.

4. The LED having a mirror protection layer of claim 3, wherein the adhesive layer has a thickness smaller than 5 nm.

5. The LED having a mirror protection layer of claim 2, wherein the protection layer is selected from a group consisting of a metal oxide and a metal nitride.

6. The LED having a mirror protection layer of claim 5, wherein the protection layer has a thickness between 30 nm and 200 nm.

7. The LED having a mirror protection layer of claim 1, wherein an area of any of the plurality of conductive holes is smaller than or equal to $\frac{1}{2}$ and greater than $\frac{1}{20}$ of an area of the protection adhesive layer.

8. The LED having a mirror protection layer of claim 1, wherein a distance between centers of any two adjacent holes of the plurality of holes is smaller than or equal to $\frac{1}{2}$ and greater than $\frac{1}{20}$ of a smallest side of the protection adhesive layer.

9. The LED having a mirror protection layer of claim 1, wherein a region of the protection adhesive layer corresponding to right below the N-type electrode is a bypass region where the plurality of conductive holes are not disposed.

10. The LED having a mirror protection layer of claim 1, wherein the plurality of conductive holes are selected from a group consisting of circular holes, square holes and rectangular holes.

11. A method for manufacturing the mirror protection layer of claim 1, comprising steps of:
   forming the P-type semiconductor layer on the metal mirror layer;
   forming the protection adhesive layer that fully covers the metal mirror layer on the metal mirror layer;
   excavating the plurality of conductive holes that penetrate through the protection adhesive layer to conduct to the metal mirror layer on the protection adhesive layer; and
   forming the metal buffer layer that penetrate through the plurality of conductive holes to be electrically connected to the metal mirror layer on the protection adhesive layer.

* * * * *